United States Patent [19]

Carlson

[11] 4,339,470
[45] Jul. 13, 1982

[54] FABRICATING AMORPHOUS SILICON SOLAR CELLS BY VARYING THE TEMPERATURE OF THE SUBSTRATE DURING DEPOSITION OF THE AMORPHOUS SILICON LAYER

[75] Inventor: David E. Carlson, Yardley, Pa.

[73] Assignee: RCA Corporation, New York, N.Y.

[21] Appl. No.: 234,567

[22] Filed: Feb. 13, 1981

[51] Int. Cl.³ ............................................. H01L 31/18
[52] U.S. Cl. ..................................... 427/39; 136/258; 357/2; 357/30; 427/74; 427/86
[58] Field of Search ............................ 427/39, 74, 86; 136/258; 357/2, 30

[56] References Cited

U.S. PATENT DOCUMENTS 4,226,643 10/1980 Carlson ............................... 136/258
4,253,882 3/1981 Dalal ............................. 136/249 TJ
4,297,392 10/1981 Higashi et al. ......................... 427/75

OTHER PUBLICATIONS

R. C. Chittick et al., "The Preparation & Properties of Amorphous Silicon", *J. Electrochem. Soc.*, vol. 116, pp. 77–81 (1969).

P. J. Zanzucchi et al., "Optical & Photoconductive Properties of Discharge-Produced Amorphous Silicon", *J. Appl. Phys.*, vol. 48, pp. 5227–5236 (1977).

D. E. Carlson et al., "The Effect of Hydrogen Content on the Photovoltaic Properties of Amorphous Silicon", *J. Electrochem. Soc.*, vol. 126, pp. 688–691 (1979).

*Primary Examiner*—Aaron Weisstuch
*Attorney, Agent, or Firm*—Birgit E. Morris; Donald S. Cohen; William J. Burke

[57] ABSTRACT

An improved process for fabricating amorphous silicon solar cells in which the temperature of the substrate is varied during the deposition of the amorphous silicon layer is described. Solar cells manufactured in accordance with this process are shown to have increased efficiencies and fill factors when compared to solar cells manufactured with a constant substrate temperature during deposition of the amorphous silicon layer.

7 Claims, No Drawings

FABRICATING AMORPHOUS SILICON SOLAR CELLS BY VARYING THE TEMPERATURE OF THE SUBSTRATE DURING DEPOSITION OF THE AMORPHOUS SILICON LAYER

The Government of the United States of America has rights in this invention pursuant to Department of Energy Contract No. EG-77-C-01-4042.

BACKGROUND OF THE INVENTION

The present invention relates to a method for manufacturing photovoltaic devices having semiconductor bodies comprised of amorphous silicon.

Photovoltaic devices, such as solar cells, are capable of converting solar radiant energy into usable electric energy. The energy conversion occurs as a result of what is known as the "photovoltaic effect". An amorphous silicon solar cell is comprised of a body of hydrogenated amorphous silicon (a-Si:H) material, which is typically formed in a glow discharge of silane. Such cells are of the type described in U.S. Pat. No. 4,064,521 entitled SEMICONDUCTOR DEVICE HAVING A BODY OF AMORPHOUS SILICON which issued to D. E. Carlson on Dec. 20, 1977 and which is herein incorporated by reference.

Within the body of the cell there is an electric field which results from the different conductivity types of the semiconductor regions comprising the body.

Typically, a P-I-N structure is used, and when light impinges upon the body photons generate electron-hole pairs in the intrinsic region of the body. In an amorphous silicon solar cell, the drift mechanism which results from the inherent electric field within the body causes electrons to flow toward the N type region and holes to flow toward the P type region which are on opposed sides of the intrinsic region. Thus, if there is an external circuit connecting the N type region to the P type region, current will flow through that circuit as long as light continues to generate electron-hole pairs in the solar cell.

As is now well known by those skilled in the art, amorphous silicon solar cells are typically fabricated by the glow discharge of silane ($SiH_4$). The process of glow discharge involves the discharge of energy through a gas at relatively low pressure in a partially evacuated chamber. In particular, the glow discharge of silane is typically conducted at a pressure not greater than about 5 Torr. As is described more fully in U.S. Pat. No. 4,142,195 entitled SCHOTIKY BARRIER SEMICONDUCTOR DEVICE AND METHOD OF MAKING SAME which issued to D. E. Carlson et al. on Feb. 27, 1979, a typical process for fabricating an amorphous silicon solar cell comprises placing a substrate on a heated element within a vacuum chamber. A screen electrode, or grid, is connected to one terminal of a power supply, and a second electrode is connected to the other terminal of the power supply such that the screen electrode is between the second electrode and the substrate. While silane, at low pressure, is admitted into the vacuum chamber, a glow discharge is established between the two electrodes and an amorphous silicon film deposits upon the substrate.

The amorphous silicon P-I-N structure can be formed either in the manner described in U.S. Pat. No. 4,064,521, in which case the substrate is typically comprised of a metal, such as aluminum, niobium, tantalum, chromium, iron, bismuth, antimony, or stainless steel. In a typical process, the amorphous silicon is doped by adding impurities to the silane. For example, the first dopant may be diborane ($B_2H_6$), which is added to the silane to form a P type amorphous silicon layer. After the P type layer has been formed to a thickness on the order of one hundred Angstroms, the diborane flow is turned off to form an intrinsic region having a thickness on the order of a few thousand Angstroms. Thereafter, an N type dopant, such as phosphine ($PH_3$), is added to the silane flow in order to form an N type amorphous silicon layer having a thickness of a few hundred Angstroms. On the N type layer, a transparent, conductive layer is formed. In a typical process, indium tin oxide (ITO) is used for this purpose.

As is well known by those skilled in the art, the P and the N type regions may be reversed. Similarly, the substrate may be formed of glass rather than a metal. In such event, a transparent, conductive coating, such as ITO, is applied to the glass substrate prior to forming the amorphous silicon. Thereafter, the cell can be formed either P-I-N or N-I-P with a metallic contact on the back, i.e., the surface removed from the substrate. These various cell types are described in the last mentioned patent to Carlson and in U.S. Pat. No. 4,162,505 issued to J. J. Hanak.

While numerous techniques have been described for forming amorphous silicon solar cells, the present state of the art is such that techniques are desired for increasing the efficiency and fill factors of such cells.

SUMMARY OF THE INVENTION

The present invention relates to an improved method for forming an amorphous silicon solar cell in which the substrate temperature is varied during the deposition of the amorphous silicon. It has been observed experimentally that when the substrate temperature is varied during the deposition of the amorphous silicon layer, such that the substrate is coolest when the incident surface of the amorphous silicon layer is deposited, there will be an improvement in the fill factor and in the efficiency of the cell thus formed. While the reasons for the beneficial results have not been fully determined, it has been hypothesized that the band gap may be opened somewhat during the deposition due to increased incorporation of hydrogen in a film deposited on a cooler substrate. Accordingly, the incident surface of the amorphous silicon layer will not absorb as much light as it would otherwise have absorbed. Thus, it is hypothesized that more light reaches the intrinsic region where electron-hole pairs are generated.

As explained above, the purpose of varying the temperature of the substrate during the deposition of the amorphous silicon layer is to increase the amount of hydrogen contained in the film, thereby opening its band gap. As will be obvious to those skilled in the art, the intent is that the portion of the film which receives light have the widest band gap. Accordingly, while reference is made to cooling the substrate during the deposition of the amorphous silicon layer in the Examples which follow, in which the amorphous silicon layers are formed on opaque substrates, the opposite approach would be used where an amorphous silicon layer is formed on a transparent substrate through which light was to be introduced into the cell. Thus, if one were to construct a solar cell that is to be illuminated through the substrate, i.e., a structure such as glass/ITO/P-I-N a-SiH/Al, one would vary the temperature during the deposition of the amorphous silicon layer by increasing it rather than by decreasing it. In the former case, the substrate temperature is cooled within the range of about 400° C. to about 200° C. during the deposition of the amorphous silicon layer. In the latter case, the substrate is heated within the range of about 200° C. to about 400° C. during the deposition of the amorphous silicon layer.

Also, while a DC proximity discharge is discussed as the method employed to form the amorphous silicon layers in the Examples, as will be obvious to those skilled in the art, either a DC anodic discharge or an RF discharge can be used.

EXAMPLES

A series of examples which show the effect of cooling the substrate during the course of depositing the amorphous silicon are described below. In each of the examples an amorphous silicon solar cell was formed on a stainless steel substrate. The structure in each case was indium tin oxide (ITO)/N-I-P amorphous silicon (a-Si:H)/stainless steel. In each case the solar cell was formed by a DC proximity glow discharge in an atmosphere of 0.5 Torr of silane ($SiH_4$).

EXAMPLE 1

The first example was a control in which the substrate temperature was maintained at 380° C. in the course of depositing the amorphous silicon layers. The open circuit voltage of the cell was 774 mV and the short circuit current density was 9.13 mA/cm$^2$. The cell had a fill factor of 0.513 and an efficiency of 3.63%.

EXAMPLE 2

In the second example the substrate was cooled during deposition from a temperature of 380° C. to 340° C. The open circuit voltage of the cell was 794 mV and the short circuit current density was 10.00 mA/cm$^2$. The cell had a fill factor of 0.542 and an efficiency of 4.30%.

EXAMPLE 3

In the third example the substrate was cooled during deposition from a temperature of 380° C. to 319° C. The open circuit voltage of the cell was 783 mV and the short circuit current density was 9.37 mA/cm$^2$. The cell had a fill factor of 0.530 and an efficiency of 3.89%.

EXAMPLE 4

In the fourth example the substrate was cooled during deposition from a temperature of 378° C. to 295° C. The open circuit voltage of the cell was 794 mV and the short circuit current density was 10.31 mA/cm$^2$. The cell had a fill factor of 0.582 and an efficiency of 4.76%.

EXAMPLE 5

In the fifth example the substrate was cooled during deposition from a temperature of 380° C. to 279° C. The open circuit voltage of the cell was 790 MV and the short circuit current density was 9.62 mA/cm$^2$. The cell had a fill factor of 0.594 and an efficiency of 4.52%.

I claim:

1. In an improved method for fabricating amorphous silicon solar cells of the type comprising an amorphous silicon layer deposited on a substrate, the improvement comprising varying the temperature of the substrate during the deposition of the amorphous silicon layer such that the temperature is lowest during the deposition of the portion of the amorphous silicon layer which will receive incident light.

2. The method of claim 1 wherein the substrate is opaque and the substrate is cooled within the range of about 400° C. to about 200° C. during the deposition of the amorphous silicon layer.

3. The method of claim 1 wherein the substrate is transparent and the substrate is heated within the range of about 200° C. to about 400° C. during the deposition of the amorphous silicon layer.

4. The method of claim 2 or claim 3 wherein the amorphous silicon layer is deposited by a glow discharge of silane.

5. The method of claim 4 wherein the glow discharge is a DC proximity discharge.

6. The method of claim 4 wherein the glow discharge is a DC anodic discharge.

7. The method of claim 4 wherein the glow discharge is an RF discharge.

* * * * *